(12) United States Patent
Owens

(10) Patent No.: US 8,395,216 B2
(45) Date of Patent: Mar. 12, 2013

(54) METHOD FOR USING HYBRID ORIENTATION TECHNOLOGY (HOT) IN CONJUNCTION WITH SELECTIVE EPITAXY TO FORM SEMICONDUCTOR DEVICES WITH REGIONS OF DIFFERENT ELECTRON AND HOLE MOBILITIES AND RELATED APPARATUS

(75) Inventor: Alexander H. Owens, Los Gatos, CA (US)

(73) Assignee: Texas Instruments Incorporated, Dallas, TX (US)

( * ) Notice: Subject to any disclaimer, the term of this patent is extended or adjusted under 35 U.S.C. 154(b) by 300 days.

(21) Appl. No.: 12/589,027

(22) Filed: Oct. 16, 2009

(65) Prior Publication Data

US 2011/0089473 A1   Apr. 21, 2011

(51) Int. Cl.
*H01L 27/12* (2006.01)
(52) U.S. Cl. ............... 257/350; 257/351; 257/E27.112
(58) Field of Classification Search ............ 257/350, 257/351, E27.112
See application file for complete search history.

(56) References Cited

U.S. PATENT DOCUMENTS

| 5,594,270 | A   | * | 1/1997  | Hiramoto et al. | 257/393 |
| 5,852,310 | A   | * | 12/1998 | Kadosh et al.   | 257/67  |
| 6,071,763 | A   | * | 6/2000  | Lee             | 438/162 |
| 6,140,163 | A   | * | 10/2000 | Gardner et al.  | 438/157 |
| 6,906,384 | B2  | * | 6/2005  | Yamada et al.   | 257/347 |
| 7,148,543 | B2  | * | 12/2006 | Yamada et al.   | 257/347 |
| 7,230,270 | B2  | * | 6/2007  | Chen et al.     | 257/67  |
| 7,358,551 | B2  |   | 4/2008  | Chidambarrao et al. | |
| 7,452,784 | B2  |   | 11/2008 | Henson et al.   | |
| 7,482,209 | B2  |   | 1/2009  | Yang et al.     | |
| 7,521,776 | B2  | * | 4/2009  | Cannon et al.   | 257/627 |
| 7,566,606 | B2  | * | 7/2009  | Currie et al.   | 438/199 |
| 7,682,941 | B2  | * | 3/2010  | Anderson et al. | 438/478 |
| 7,781,840 | B2  | * | 8/2010  | White et al.    | 257/351 |
| 7,790,528 | B2  | * | 9/2010  | Spencer et al.  | 438/154 |
| 7,818,702 | B2  | * | 10/2010 | Mandelman et al. | 716/118 |
| 8,159,030 | B2  | * | 4/2012  | Waite et al.    | 257/347 |
| 2001/0045604 | A1 |   | 11/2001 | Oda et al.     | |
| 2005/0104127 | A1 | * | 5/2005  | Kang et al.    | 257/350 |
| 2006/0022274 | A1 | * | 2/2006  | Hasegawa et al. | 257/358 |

(Continued)

OTHER PUBLICATIONS

Notification of Transmittal of the International Search Report and The Written Opinion of the International Searching Authority, or the Declaration dated May 30, 2011 in connection with International Patent Application No. PCT/US2010/052816.

(Continued)

*Primary Examiner* — Ida M Soward
(74) *Attorney, Agent, or Firm* — Jacqueline J. Garner; Wade J. Brady, III; Frederick J. Telecky, Jr.

(57) ABSTRACT

A semiconductor apparatus includes a first substrate and a second substrate located over a first portion of the first substrate and separated from the first substrate by a buried layer. The semiconductor apparatus also includes an epitaxial layer located over a second portion of the first substrate and isolated from the second substrate. The semiconductor apparatus further includes a first transistor formed at least partially in the second substrate and a second transistor formed at least partially in or over the epitaxial layer. The second substrate and the epitaxial layer have bulk properties with different electron and hole mobilities. At least one of the transistors is configured to receive one or more signals of at least about 5V. The first substrate could have a first crystalline orientation, and the second substrate could have a second crystalline orientation.

14 Claims, 9 Drawing Sheets

U.S. PATENT DOCUMENTS

| | | |
|---|---|---|
| 2006/0065930 A1 | 3/2006 | Kelman |
| 2006/0076624 A1* | 4/2006 | Nagano et al. .................. 257/350 |
| 2006/0091471 A1* | 5/2006 | Frohberg et al. .............. 257/369 |
| 2006/0208320 A1 | 9/2006 | Tsuchiya et al. |
| 2006/0292770 A1 | 12/2006 | Wu et al. |
| 2007/0048919 A1 | 3/2007 | Adetutu et al. |
| 2007/0205460 A1 | 9/2007 | Chidambarrao |
| 2007/0269945 A1* | 11/2007 | Ieong et al. .................... 438/222 |
| 2008/0128821 A1 | 6/2008 | Pinto et al. |
| 2008/0179680 A1* | 7/2008 | Chidambarrao et al. ...... 257/351 |
| 2008/0203484 A1* | 8/2008 | Hofmann et al. .............. 257/369 |
| 2008/0268587 A1* | 10/2008 | Sadaka et al. .................. 438/199 |
| 2008/0274595 A1* | 11/2008 | Spencer et al. ................ 438/154 |
| 2009/0032874 A1 | 2/2009 | Loubet et al. |
| 2009/0057746 A1* | 3/2009 | Sugll et al. ..................... 257/315 |
| 2009/0072312 A1* | 3/2009 | Chang et al. ................... 257/351 |
| 2009/0095981 A1 | 4/2009 | Kang et al. |
| 2010/0032761 A1* | 2/2010 | Ding et al. ..................... 257/350 |
| 2010/0047985 A1* | 2/2010 | Murthy et al. ................. 438/303 |
| 2010/0213553 A1* | 8/2010 | Hargrove et al. .............. 257/410 |
| 2011/0102019 A1* | 5/2011 | Osada et al. ................... 326/102 |
| 2012/0043641 A1* | 2/2012 | Yu et al. ......................... 257/506 |

OTHER PUBLICATIONS

P.M. Mooney, "Improved CMOS performance via enhanced carrier mobility", Materials Science and Engineering B 134 (2006), pg 133-137.

L. K. Bera, et al., "A Dual-Strained CMOS Structure Through Simultaneous Formation of Relaxed and Compressive Strained-SiGe-on-Insulator", IEEE Electron Device Letters, vol. 27, No. 5, May 2006, p. 350-353.

Min Yang, et al., "Hybrid-Orientation Technology (HOT): Opportunities and Challenges", IEEE Transactions on Electron Devices, vol. 53, No. 5, May 2006, p. 965-978.

Young-Kyun Cho, et al., "High Performance Power MOSFETs with Strained-Si Channel", Proceedings of the 17th International Symposium on Power Semiconductor Devices & IC's, May 23-26, 2005, Santa Barbara, CA, p. 191-194.

* cited by examiner

METHOD FOR USING HYBRID ORIENTATION TECHNOLOGY (HOT) IN CONJUNCTION WITH SELECTIVE EPITAXY TO FORM SEMICONDUCTOR DEVICES WITH REGIONS OF DIFFERENT ELECTRON AND HOLE MOBILITIES AND RELATED APPARATUS

TECHNICAL FIELD

This disclosure is generally directed to integrated circuits. More specifically, this disclosure is directed to a method for improved mobility using hybrid orientation technology (HOT) in conjunction with selective epitaxy and related apparatus.

BACKGROUND

Complimentary metal oxide semiconductor (CMOS) circuits are often formed on silicon substrates having a (100) crystalline orientation. Hybrid orientation technology (HOT) uses different crystalline orientations on a single substrate. For example, hybrid orientation technology could mix a (100) crystalline orientation substrate and a (110) crystalline orientation substrate on the same semiconductor wafer. This is typically done to help improve hole and electron mobilities within a semiconductor device.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
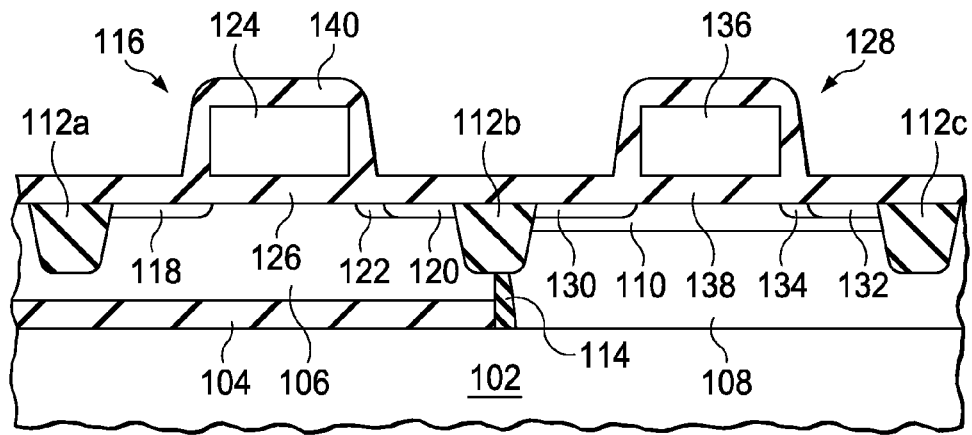
FIG. 1 illustrates an example integrated circuit device using hybrid orientation technology (HOT) in conjunction with selective epitaxy according to this disclosure.

FIG. 1 illustrates an example integrated circuit device 100 using hybrid orientation technology (HOT) in conjunction with selective epitaxy according to this disclosure. The embodiment of the integrated circuit device 100 shown in FIG. 1 is for illustration only. Other embodiments of the integrated circuit device 100 could be used without departing from the scope of this disclosure.

As shown in FIG. 1, the integrated circuit device 100 includes a wafer 102. The wafer 102 represents any suitable semiconductor substrate that can be used to carry or support other components of the integrated circuit device 100. For example, the wafer 102 could represent a P− substrate with a (100) crystalline orientation at 30 Ω/cm.

A buried layer 104 resides above a portion of the wafer 102. The buried layer 104 generally represents a thin layer of oxide or other material(s) for electrically isolating other components of the integrated circuit device 100. The buried layer 104 could, for example, represent a silicon oxide layer or other oxide layer with a thickness of approximately 1,450 Å or 2,000 Å.

A substrate 106 resides above the buried layer 104. The substrate 106 could represent any suitable semiconductor substrate. For example, the substrate 106 could represent an N-substrate with a (110) crystalline orientation at 30 Ω/cm and a thickness between approximately 2 µm and approximately 5 µm. The substrate 106 and the wafer 102 can have different crystalline orientations, thereby implementing the HOT approach. For convenience, the wafer 102 may be referred to as a "first semiconductor substrate," and the substrate 106 may be referred to as a "second semiconductor substrate."

An epitaxial layer 108 also resides above the wafer 102. The epitaxial layer 108 could represent any suitable epitaxial material(s). For example, the epitaxial layer 108 could be formed from silicon germanium, such as $Si_{0.85}Ge_{0.15}$. Other materials could be used in the epitaxial layer 108, such as silicon tin (SiSn) or carbon-doped silicon germanium (SiGeC). In some embodiments, the epitaxial layer 108 has a crystalline orientation that is different than the orientation of the substrate 106, such as the (100) orientation.

A cap 110 can be formed over the epitaxial layer 108. The cap 110 could be formed from one or more semiconductor substrate materials, such as silicon. In particular embodiments, the cap 110 could be formed from P− silicon at 30 Ω/cm with a thickness of approximately 1,000 Å. Note that in other embodiments, the cap 110 could be omitted.

In this example, trenches 112a-112c are used to help electrically isolate different portions of the structure. The trenches 112a-112c could represent any suitable isolation structures, such as shallow trench isolation (STI) structures. The trenches 112a-112c could be formed in any suitable manner and from any suitable material(s), such as an oxide. Also, a spacer 114 can separate the substrate 106 from the epitaxial layer 108. The spacer 114 could be formed in any suitable manner and from any suitable material(s), such as an oxide.

A p-channel metal oxide semiconductor (PMOS) device 116 is formed using the substrate 106. As shown in FIG. 1, the PMOS device 116 includes a source 118, a drain 120, an offset 122, and a gate 124. Each of the source 118, drain 120, and offset 122 generally denotes an area of the substrate 106 that has been doped with one or more suitable dopants. For example, the source 118 and drain 120 could include p+ dopant, and the offset 122 could include p− dopant. The gate 124 generally denotes an electrically conductive area, such as one formed from polysilicon, that can be used to control the operation of the PMOS device 116. The gate 124 is typically separated from the substrate 106 by a gate oxide 126. Each of these components 118-126 could be formed in any suitable manner using any suitable material(s).

An n-channel metal oxide semiconductor (NMOS) device 128 is formed using the cap 110 (although in other embodiments the NMOS device 128 is formed in the epitaxial layer 108). The NMOS device 128 includes a source 130, a drain 132, an offset 134, and a gate 136. The gate 136 is separated from the cap 110 by a gate oxide 138. These components 130-138 may be the same as or similar to the corresponding components 118-126 in the PMOS device 116, but different dopings are used in the NMOS device 128. For example, the source 130 and drain 132 could include n+ dopant, and the offset 134 could include n− dopant. Each of these components 130-138 could be formed in any suitable manner using any suitable material(s). Note that the formation of different components in the PMOS and NMOS devices 116 and 128 could overlap, such as when the gates 124 and 136 are formed using the same process steps. The gate oxides 126 and 138 may or may not be formed using the same process steps.

An oxide layer 140 is formed over the PMOS and NMOS devices 116 and 128. The oxide layer 140 typically protects the underlying components of the integrated circuit device 100 during subsequent processing steps. The oxide layer 140 could represent any suitable oxide material(s) and can be formed in any suitable manner.

In some embodiments, the PMOS and NMOS devices 116 and 128 could represent devices having higher operating voltages, such as 5V+ PMOS and NMOS devices. This level of operating voltage often cannot be obtained using conventional CMOS systems. Also, the integrated circuit device 100 here supports the use of different materials and orientations to support both higher electron mobility and higher hole mobility. For instance, the (110) orientation of the substrate 106 can provide better hole mobility, while the epitaxial layer 108 with an adjustable germanium concentration can provide better electron mobility. Both of these structures can be used in the same integrated circuit device and on the same wafer.

Further, note that the improved hole and electron mobilities here are bulk properties, meaning they are inherent characteristics of the structures rather than being caused solely by stress. This is useful in forming higher voltage devices (such as 5V+ PMOS and NMOS devices) used in applications such as mixed-signal analog applications. These types of devices often are not fabricated using deep sub-micron techniques since those techniques offer little benefit to these types of devices, so those techniques are usually limited to use with low voltage devices. The higher voltage devices often do not scale to deep sub-micron dimensions and are therefore not driven by photolithography but by the bulk material properties. In addition, devices formed in this manner could have improved transistor on-resistances ($RDS_{ON}$) and transconductances, smaller die sizes, and lower costs.

Although FIG. 1 illustrates one example of an integrated circuit device 100 using HOT in conjunction with selective epitaxy, various changes may be made to FIG. 1. For example, the relative sizes and shapes of the various components in FIG. 1 are for illustration only. Also, while certain components in FIG. 1 have been described above as being formed from particular materials, each component in FIG. 1 could be formed from any suitable material(s) and in any suitable manner. In addition, various other layers or structures could be formed within the integrated circuit device 100 depending on the fabrication process. Those other layers or structures are omitted from FIG. 1 for the sake of clarity.

FIGS. 2A through 2K illustrate an example technique for forming an integrated circuit device using HOT in conjunction with selective epitaxy according to this disclosure. The embodiment of the technique shown in FIGS. 2A through 2K is for illustration only. Other techniques could be used to form the integrated circuit device without departing from the scope of this disclosure.

Figure 2A:
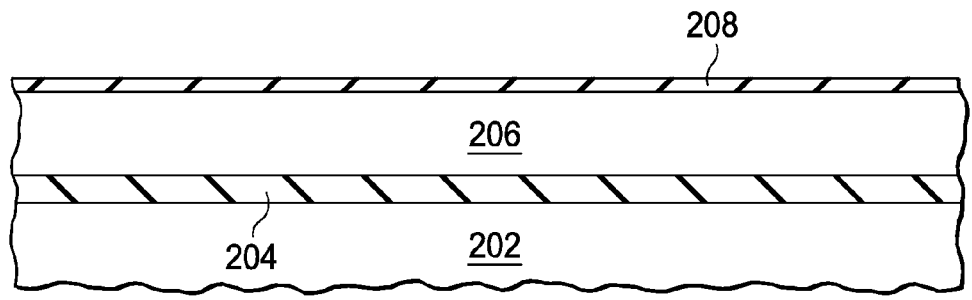
FIGS. 2A through 2K illustrate an example technique for forming an integrated circuit device using HOT in conjunction with selective epitaxy according to this disclosure.

As shown in FIG. 2A, a semiconductor-on-insulator (SOI) structure is formed or otherwise obtained. The structure includes a wafer 202 and a buried layer 204 formed across the wafer 202. The wafer 202 could represent a P− substrate with a (100) orientation at 30 Ω/cm. The buried layer 204 could represent a silicon oxide layer or other oxide layer with a thickness of approximately 1,450 Å or 2,000 Å. Over the buried layer 204 is a substrate 206, such as an N− substrate with a (110) orientation at 30 Ω/cm and a thickness of approximately 2 μm to approximately 5 μm. In particular embodiments, the SOI structure formed from the components 202-206 could be purchased directly from a vendor. In other particular embodiments, the SOI structure can be manufactured in any suitable manner.

A screen oxide layer 208 is formed over the substrate 206. Formation of the screen oxide layer 208 could include a screen oxidation cleaning process, a screen oxidation process where a portion of the substrate 206 is oxidized (such as by using a dry oxidation at 1100° C. for approximately 49 minutes), and post-oxidation operations. In particular embodiments, the screen oxide layer 208 has a thickness of 350 Å±35 Å.

Figure 2B:
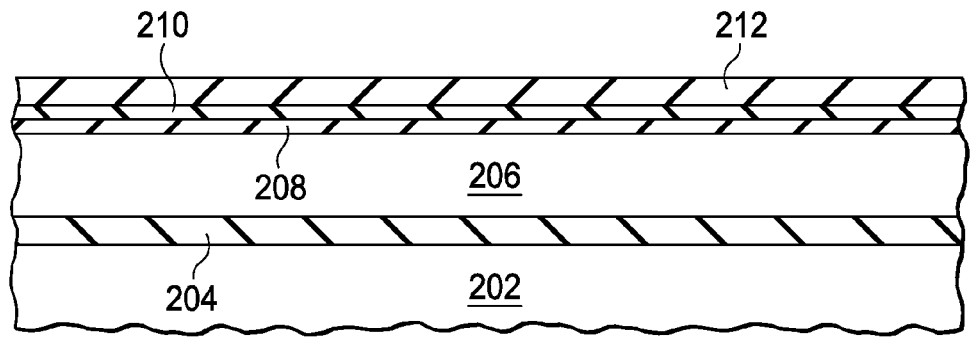

As shown in FIG. 2B, a pad oxide layer 210 is formed over the structure. Formation of the pad oxide layer 210 could include a pad oxidation pre-cleaning process, a pad oxidation process (such as by using a dry oxidation at 920° C. for approximately 40 minutes), and post-oxidation operations. In particular embodiments, the pad oxide layer 210 has a thickness of 110 Å±10 Å. A nitride layer 212 is formed over the pad oxide layer 210. Formation of the nitride layer 212 could include nitride deposition using $NH_3/N_2/DCS/HCl$ at a temperature of 760° C. for approximately 160 minutes. In particular embodiments, the nitride layer 212 has a thickness of 1625 Å±150 Å.

Figure 2C:
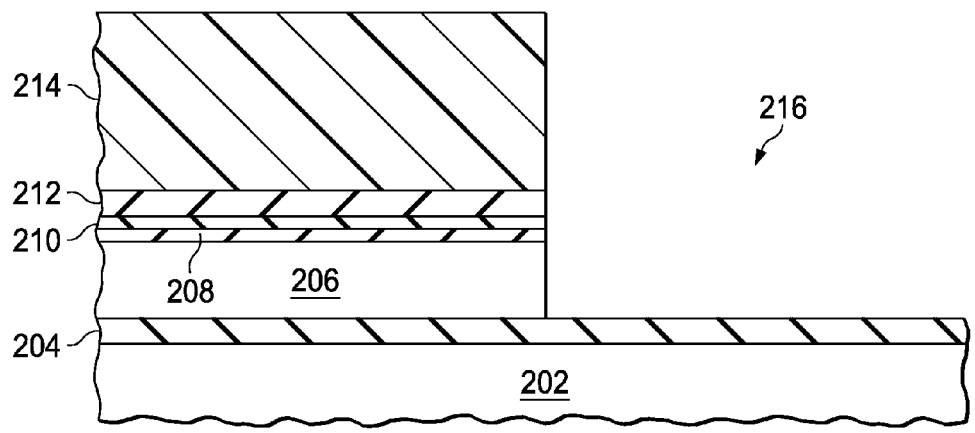

As shown in FIG. 2C, a photoresist mask 214 is formed over the nitride layer 212. The photoresist mask 214 can be patterned to include an opening 216 over the area where an NMOS device is going to be formed. The photoresist mask 214 covers the area where a PMOS device is going to be formed. An etch may then occur to remove a portion of the substrate 206. The etch process could represent an NMOS photo and deep silicon etch process designed to stop upon reaching the buried layer 204. A resist clean and polymer removal process can follow the etch process to remove the remaining photoresist mask 214.

Figure 2D:
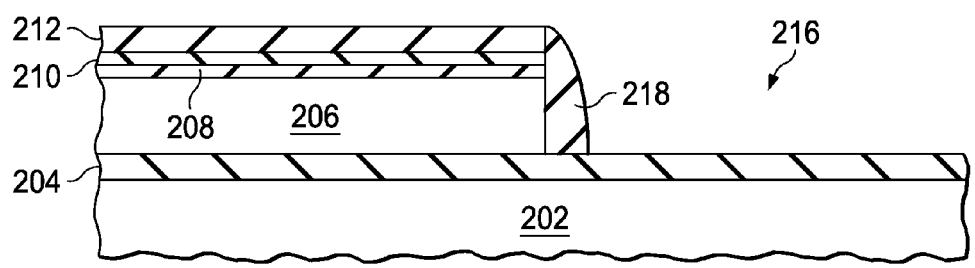

As shown in FIG. 2D, an oxide spacer 218 is formed against the substrate 206. Formation of the oxide spacer 218 could include performing a spacer oxide deposition process to deposit a layer of oxide (such as an oxide layer 2,000 Å or 3,000 Å thick) over the structure. The layer of oxide is then etched to form the oxide spacer 218. The etch could include a spacer etchback process that stops at the wafer 202. Alternatively, the etch could include a spacer etchback process that stops at the buried layer 204, followed by an etch (such as an HCl wet etch) to remove the exposed portion of the buried layer 204 and reveal the wafer 202.

Figure 2E:
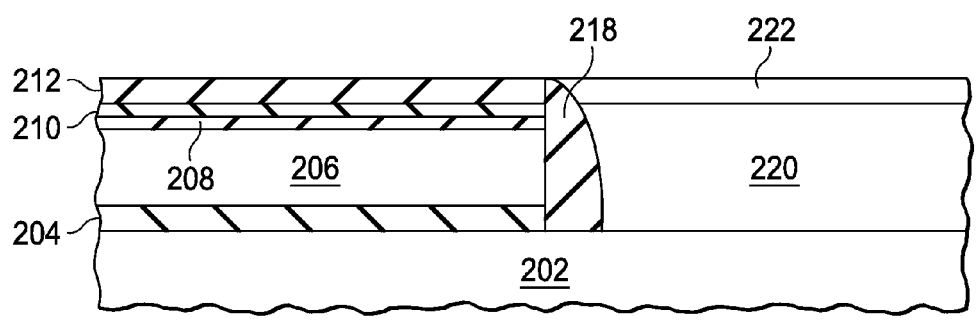

As shown in FIG. 2E, an epitaxial layer 220 is formed in the opening 216 above the exposed portion of the wafer 202, such as by using an epitaxial deposition process. The epitaxial layer 220 could be formed from a graded silicon germanium, such as $Si_{0.85}Ge_{0.15}$ having a (100) orientation. The epitaxial layer 220 could have a thickness of approximately 3 μm±0.5 μm or approximately 5 μm±0.2 μm. The epitaxial layer 220 could be underfilled, such as when the top surface of the epitaxial layer 220 is approximately 2,000 Å below the top surface of the nitride layer 212. A cap 222 can be formed over the epitaxial layer 220, such as by growing a layer of P− silicon at 30 Ω/cm with a thickness of approximately 1,000 Å.

Figure 2F:
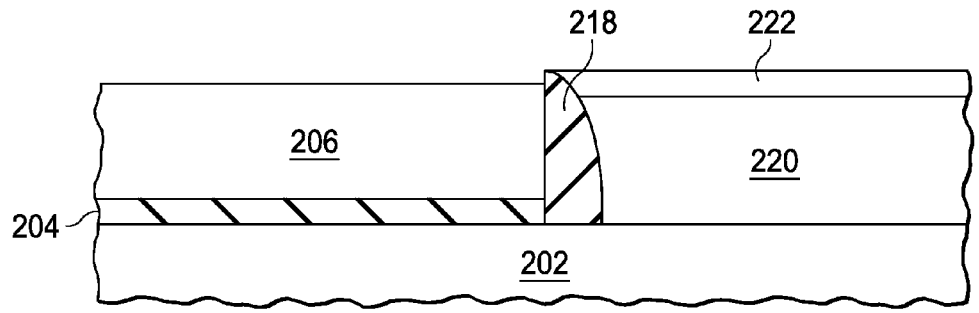

As shown in FIG. 2F, the nitride layer 212 and oxide layers 208-210 are removed. This could occur, for example, by stripping the nitride and oxide layers to expose the substrate 206.

Figure 2G:
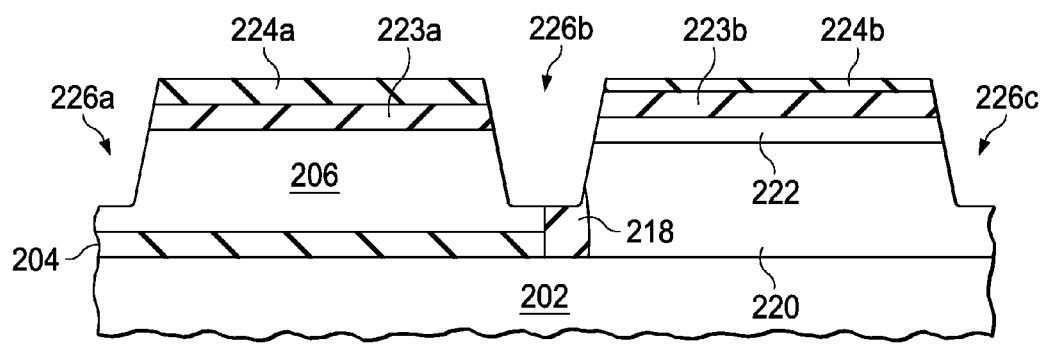

As shown in FIG. 2G, a pad oxide layer 223a-223b is formed over the structure, and a nitride stack 224a-224b is formed over the pad oxide layer 223a-223b. The nitride stack 224a-224b could include a nitride layer and a silicon oxynitride (SiON) layer. Formation of the pad oxide layer 223a-223b could include a pad oxidation pre-cleaning process, a pad oxidation process (such as by using a dry oxidation at 920° C. for approximately 40 minutes), and post-oxidation operations. Formation of the nitride layer in the nitride stack 224a-224b could include nitride deposition using $NH_3/N_2/DCS/HCl$ at a temperature of 760° C. for approximately 160 minutes. Formation of the SiON layer in the nitride stack 224a-224b could include depositing SiON to form an anti-reflective coating layer. In particular embodiments, the pad oxide layer has a thickness of 110 Å±10 Å, the nitride layer has a thickness of 1625 Å±150 Å, and the SiON layer has a thickness of 320 Å±32 Å.

Trenches 226a-226c are formed in the structure using any suitable technique. For example, a mask (such as a composite mask) can be formed on the structure and patterned to expose areas where the trenches 226a-226c are to be formed. A Develop Inspection Critical Dimensions (DICD) process can be used to inspect the mask and ensure that the mask is suitable, such as by ensuring that the mask has openings with a width of 0.25 μm±0.023 μm. An etch (such as a composite plasma etch) can be used to form the trenches 226a-226c, such as trenches having a depth of 5,600 Å±400 Å. The mask can then be removed, such as by using a solution of $H_2SO_4/H_2O_2$ plus SC1 for five minutes. A Final Inspection Critical Dimensions (FICD) process can be used to inspect the resulting trenches 226a-226c and ensure that the trenches are suitable, such as by ensuring that the trenches have a minimum width of 0.22 μm±0.025 μm.

Figure 2H:
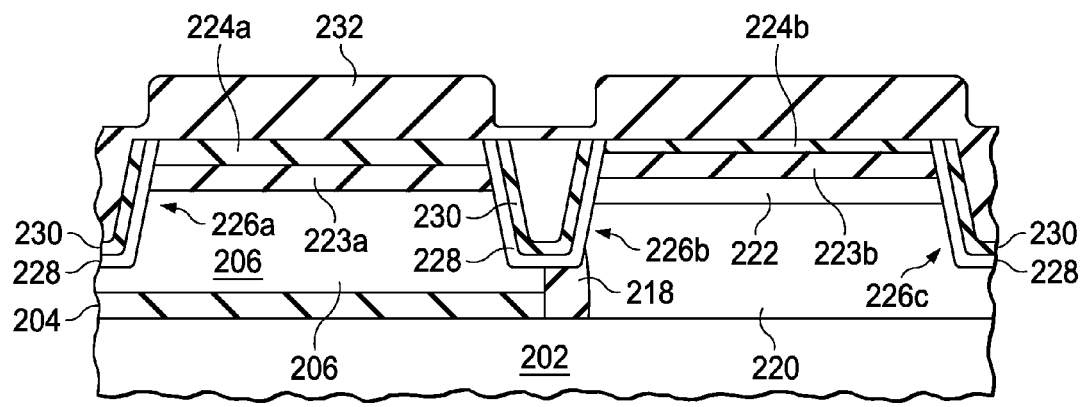

As shown in FIG. 2H, the trenches 226a-226c are filled to create isolation trenches. A field pre-cleaning process can be performed, and a trench liner can be formed in each trench. For example, the trench liner can be formed using a selective deposition of silicon 228 (such as 400 Å or 600 Å silicon), followed by formation of a trench liner oxide 230. The trench liner oxide 230 could be formed using in situ steam generation (ISSG) to form a layer of thermal oxide with a thickness of 200 Å±20 Å. After liner oxide cleanup operations, a trench anneal may or may not occur. An oxide layer 232 is formed over the structure, which fills the remainder of the trenches 226a-226c. The oxide layer 232 could be formed, for example, using a high density plasma (HDP) STI oxide deposition process. A cleaning process and possibly a rapid thermal anneal (RTA) could occur. The oxide layer 232 could have a thickness of 5,976 Å±426 Å. The use of a trench liner here can help to reduce junction leakage and improve oxide quality of the oxide layer 232.

Figure 2I:
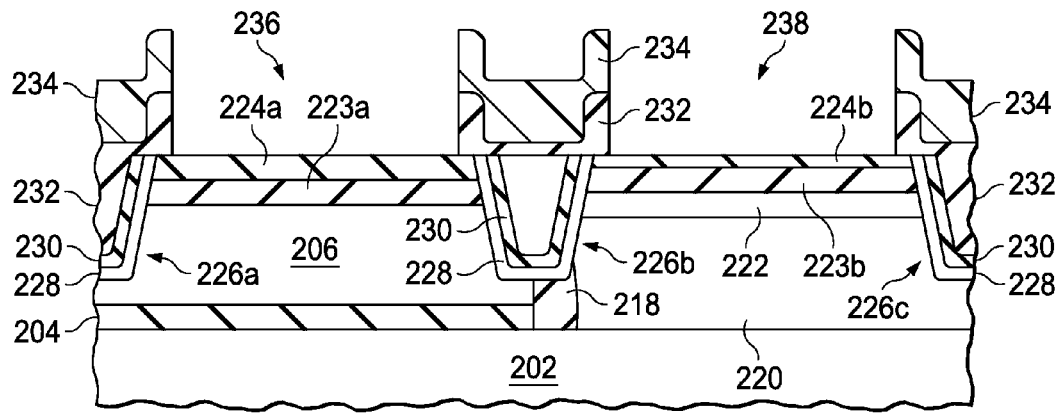

As shown in FIG. 2I, a reverse mask 234 is formed over the oxide layer 232 and patterned to form openings 236-238. The oxide layer 232 under the reverse mask 234 is then etched. The reverse mask 234 could be formed, for example, using a reverse mask and a reverse mask overlay, etching the reverse mask, and ashing the reverse mask at 250° C. for 70 seconds. After the etch, the reverse mask 234 can be removed during a reverse mask clean, which could use a solution of $H_2SO_4/H_2O_2$ plus SC1 for ten minutes.

Figure 2J:
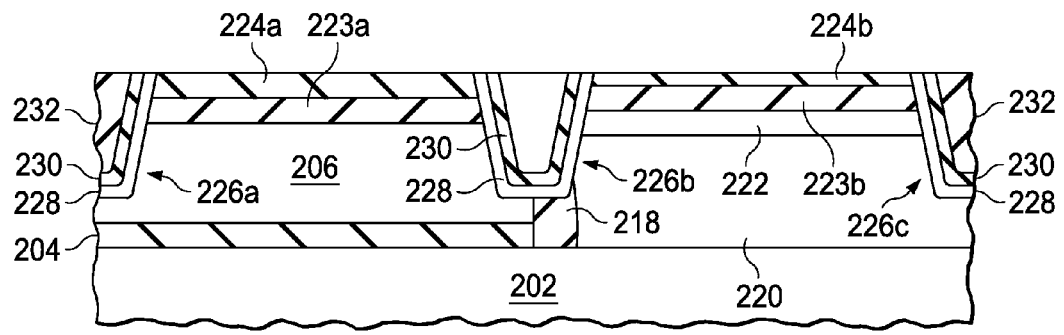

As shown in FIG. 2J, the portions of the reverse mask 234 and the oxide layer 232 remaining above the nitride stack 224a-224b are removed. This could involve the use of a chemical mechanical polish (CMP) operation. A portion of the oxide layer 232 remains in the trenches 226a-226c. This portion of the oxide layer 232 could have a thickness of 4,000 Å±400 Å.

Figure 2K:
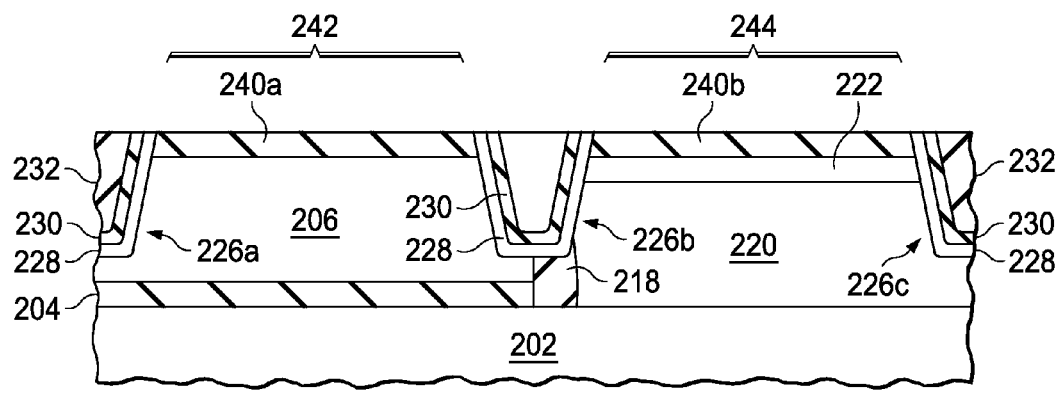

As shown in FIG. 2K, the nitride stack 224a-224b and the pad oxide layer 223a-223b are removed. This could occur, for example, by forming and curing an open mask and then performing an open mask etch. The etch could include a buffered oxide etch (BOE) for 2.5 minutes and a wet etch using $H_2SO_4/H_2O_2$ plus SC1 for ten minutes to remove the SiON layer. A wet etch using HF for 1.5-minutes and $H_3PO_4$ plus SC1 for ten minutes can be used to remove the nitride layer. The pad oxide layer can be removed using a pad oxide strip, which may or may not leave a very thin oxide (such as 80 Å±50 Å) on the structure. A gate oxide layer 240a-240b is formed over the structure. The gate oxide layer 240a-240b could be formed, for example, using a 120 Å steam process.

At this point, a PMOS device can be formed in a first area 242 of the structure shown in FIG. 2K, and an NMOS device can be formed in a second area 244 of the structure shown in FIG. 2K. The first area 242 includes a substrate material having a first orientation (such as the (110) orientation) that may provide improved hole mobility. The second area 244 includes an epitaxial material (such as SiGe) that provides improved electron mobility and possibly has a second orientation (such as the (100) orientation). The PMOS and NMOS devices could be formed using, for example, standard CMOS processes.

Note that the use of a semiconductor-on-insulator structure can raise issues with heat dissipation. However, this can be largely mitigated or avoided, such as by using careful layout of components or by using conduction stripes that allow heat dissipation directly to the wafer 202.

Also note that substrate-induced straining can be used to alter the mobility of the NMOS device to be formed. Substrate-induced straining can be produced using the epitaxial layer 220 and the cap 222. The epitaxial layer 220 can represent a straining layer that is compatible with silicon or other material used in the cap 222. The epitaxial layer 220 therefore can increase or decrease the lattice spacing of the cap 222, and the cap 222 is in either tension or compression depending on the material(s) used to form the epitaxial layer 220. The source and drain of an NMOS device can be formed in the cap 222, and the tension or compression of the cap 222 can affect the operation of the NMOS device.

Moreover, attention can be given to the subsequent CMOS processing steps used to form the PMOS and NMOS devices. Strain relief can increase with increasing thermal budgets, germanium content, and cap thickness. The epitaxial layer 220 and cap 222 may be exposed during subsequent operations to high temperatures, such as during oxide growths or activation anneals. In some embodiments, all thermal cycles after formation of the epitaxial layer 220 and cap 222 may be kept below 1,000° C. and be as short as possible, and techniques such as ISSG and rapid thermal processing (RTP) may be used whenever possible.

In addition, the following may be considered when forming specific devices implementing this approach. If standard CMOS transistors are needed in an integrated circuit in addition to the PMOS and NMOS devices formed in the areas 242-244 of the structure shown in FIG. 2K, those transistors could be formed in the substrate 206. Also, because of high currents, and high densities associated with operation of the PMOS and NMOS devices, electro-migration issues can be considered when designing a circuit, and appropriate materials (such as copper) can be selected for use in forming local interconnects. In addition, if a common gate oxide cannot be used in both the PMOS and NMOS devices, a dual poly-dual gate oxide (DP-DGO) approach could be used to form the PMOS and NMOS devices.

Although FIGS. 2A through 2K illustrate one example of a technique for forming an integrated circuit device using HOT in conjunction with selective epitaxy, various changes may be made to FIGS. 2A through 2K. For example, while these figures illustrate example structures at different manufacturing stages, various techniques can be used to form the integrated circuit device. As a result, one or more steps could be omitted, modified, or rearranged and additional steps could be added. Also, various modifications could be made to the structures shown in FIGS. 2A through 2K. Further, while certain components have been described above as being formed from particular materials, each component could be formed from any suitable material(s) and in any suitable manner. As particular examples, while silicon germanium is described as being used in the epitaxial layer 220, other materials (such as GaN, GaAs, SiC, AlN, or diamond) could be used. In addition, the relative sizes and shapes of the components are for illustration only.

FIGS. 3A through 3G illustrate example details regarding faults in an integrated circuit device according to this disclosure. The details shown in FIGS. 3A through 3G are for illustration only. Other integrated circuits may have different fault characteristics without departing from the scope of this disclosure.

Figure 3A:
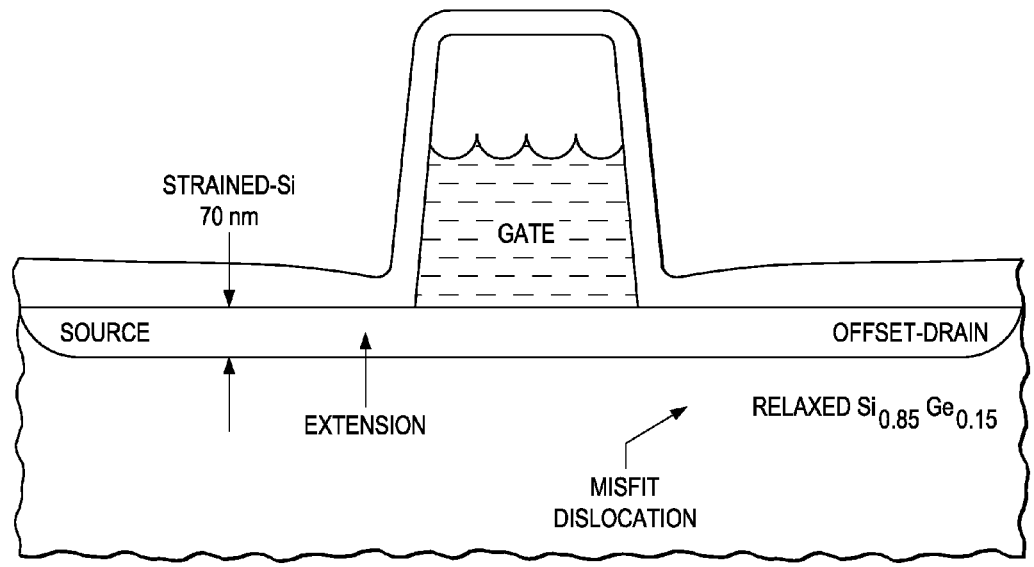
FIGS. 3A through 3G illustrate example details regarding faults in an integrated circuit device according to this disclosure.
Figure 3B:
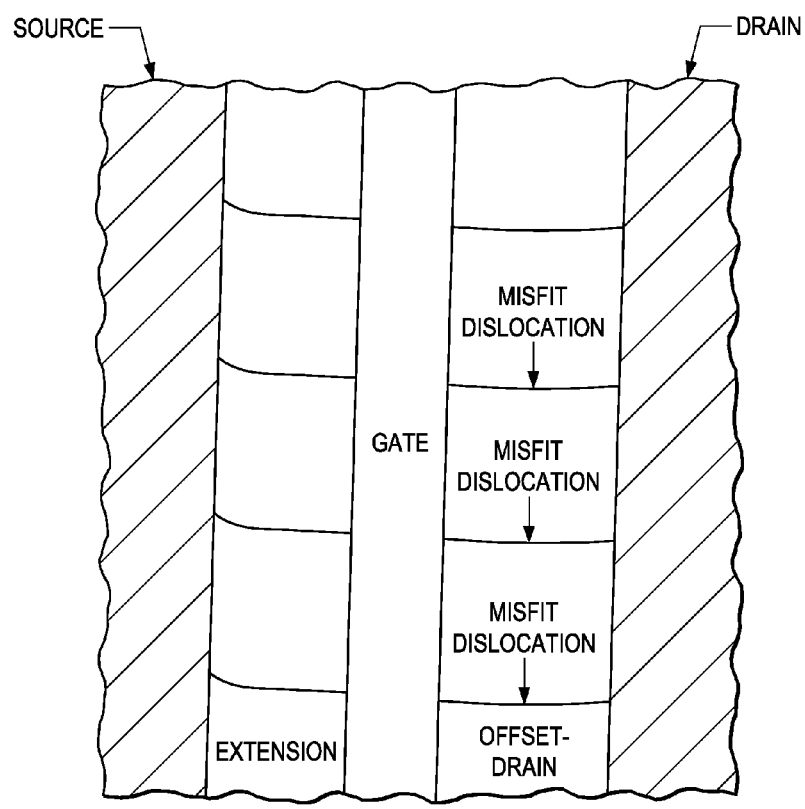

FIG. 3A illustrates a cross-sectional view of an NMOS device implemented in an integrated circuit device, such as in the area 244 of the structure shown in FIG. 2K. FIG. 3B illustrates a length view of the same NMOS device. As shown here, the NMOS device is implemented using a 70 nm strained silicon cap over a relaxed $Si_{0.85}Ge_{0.15}$ epitaxial layer. Misfit dislocations are a common fault that can occur in transistor devices. As shown in FIG. 3A, a misfit dislocation can form in the $Si_{0.85}Ge_{0.15}$ epitaxial layer. As shown in FIG. 3B, a series of misfit dislocations can form along the length of the NMOS device.

Figure 3C:
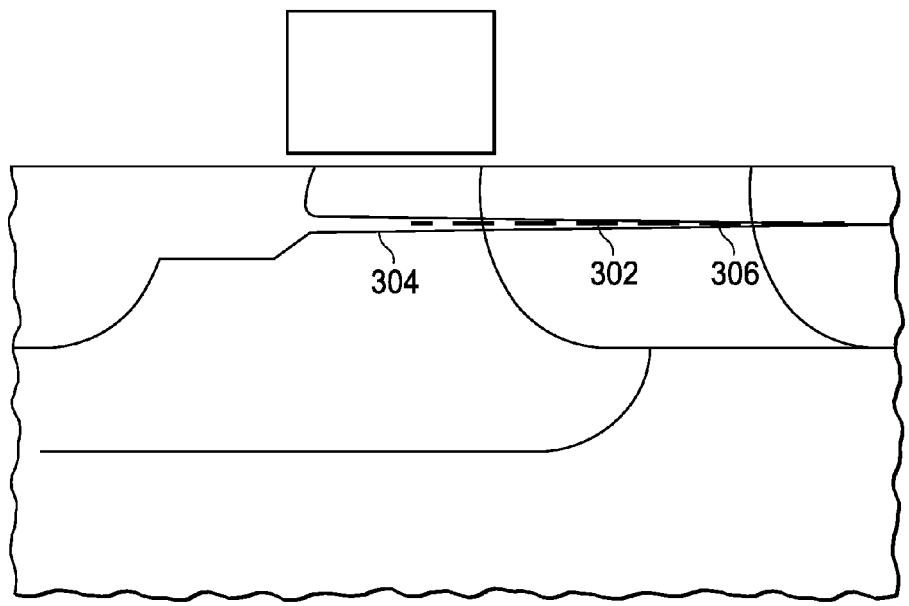
Figure 3D:
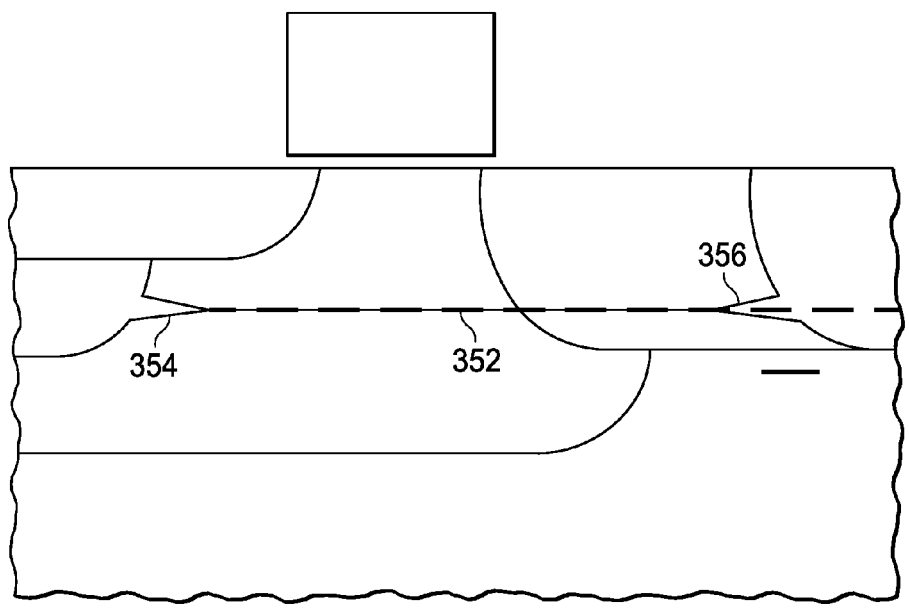

FIG. 3C illustrates the effects of misfit dislocations 302 in a standard NMOS device. Here, the misfit dislocations 302 allow for greater diffusion of material into the surrounding substrate, which causes horizontal peaks 304-306 to form in the source and drain regions of the transistor. These peaks 304-306 lead to higher junction leakage in the transistor. In contrast, FIG. 3D illustrates the effects of misfit dislocations 352 in an NMOS device formed in a 70 nm strained silicon cap above a relaxed $Si_{0.85}Ge_{0.15}$ epitaxial layer. As shown in FIG. 3D, horizontal peaks 354-356 can still form in the source and drain regions of the transistor. However, the peaks 354-356 are smaller and farther apart compared to the peaks in FIG. 3C. As a result, the transistor shown in FIG. 3D suffers from less junction leakage.

Figure 3E:
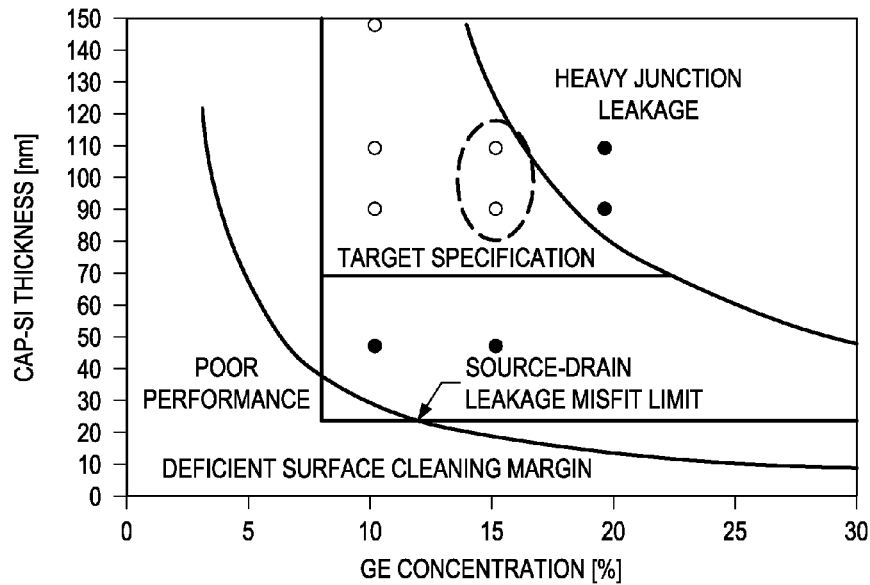

As shown in FIG. 3E, the relationship between germanium concentration in the epitaxial layer and the silicon cap thickness can be mapped to different regions associated with different junction leakages. Open circles in FIG. 3E represent less leakage current, while solid circles in FIG. 3E represent excessive leakage current. As shown here, it is possible to select the silicon cap thickness and the epitaxial layer germanium concentration for a particular NMOS design to achieve a desired leakage current level or range. Note that the same type of chart could be constructed for devices that use different materials in the cap or different materials in the epitaxial layer.

Figure 3F:
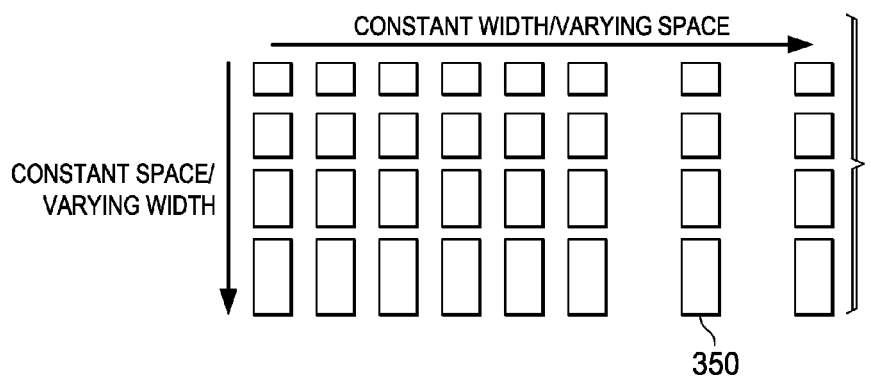

Referring back to FIG. 3B, the distance between adjacent misfit locations can be denoted $\gamma$. The distance $\gamma$ is sensitive to various factors, such as germanium concentration, silicon cap thickness, and thermal budget. One possible way to characterize the distance $\gamma$ for a given germanium concentration, a given silicon cap thickness, and a given thermal budget is shown in FIG. 3F. Here, multiple islands 350 (each representing a SiGe epitaxial layer covered by a silicon cap) can be formed on a wafer. The islands 350 have a constant width and variable spacing across the wafer, and the islands 350 have a variable width and constant spacing down the wafer. After fabrication, the islands 350 can be examined, such as optically using dark field illumination, to identify the specific size/space combination that minimizes the number of misfit dislocations. In this way, the best size/space combination for a given germanium concentration/silicon cap thickness/thermal budget combination can be identified. This could be repeated for different germanium concentration/silicon cap thickness/thermal budget combinations.

Figure 3G:
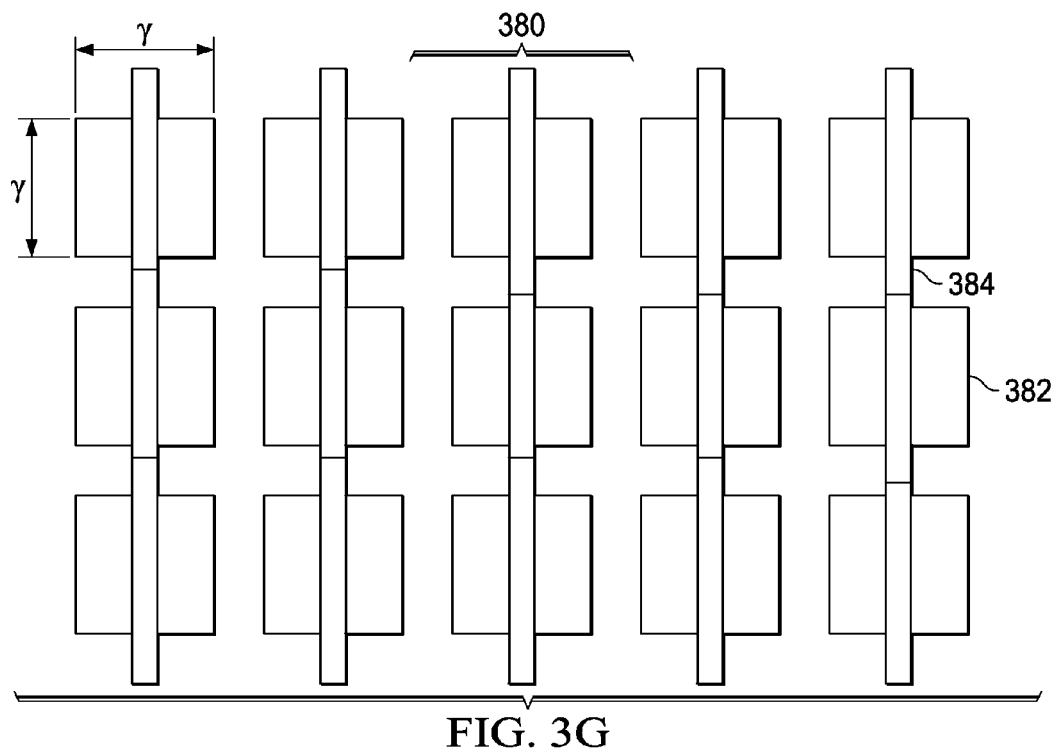

Once the distance $\gamma$ is determined for a given implementation, a circuit could be laid out as shown in FIG. 3G, where each of multiple transistors 380 is formed using multiple islands 382 connected by local interconnects 384. Each of the islands 382 could have length and width dimensions equal to the identified distance $\gamma$. Ideally, this could help to minimize or eliminate misfit dislocations in the transistors 380.

Although FIGS. 3A through 3G illustrate example details regarding faults in an integrated circuit device, various changes may be made to FIGS. 3A through 3G. For example, other techniques could be used to identify an acceptable distances y. Also, transistors 380 could be formed in any other suitable manner.

Figure 4:
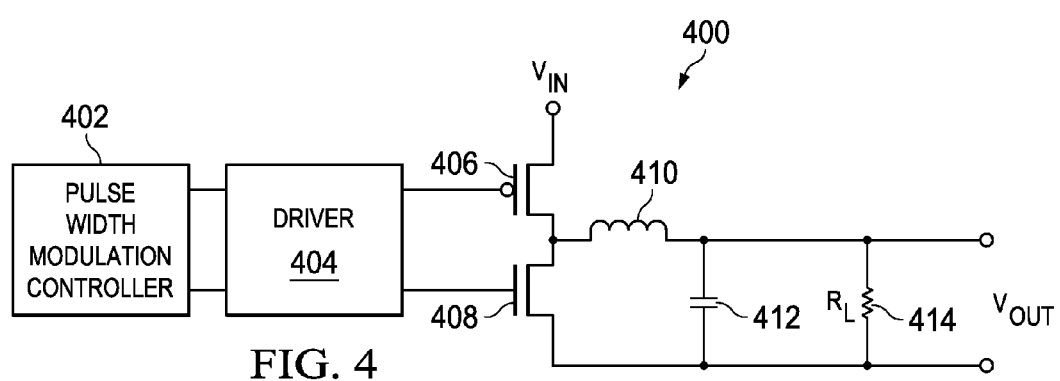
FIG. 4 illustrates an example circuit having transistor devices formed using HOT in conjunction with selective epitaxy according to this disclosure.

FIG. 4 illustrates an example circuit 400 having transistor devices formed using HOT in conjunction with selective epitaxy according to this disclosure. The embodiment of the circuit 400 shown in FIG. 4 is for illustration only.

In this particular example, the circuit 400 represents a buck regulator having a pulse width modulation (PWM) controller 402, a driver 404, and two transistors 406-408. The PWM controller 402 generally operates to output a signal having an adjustable pulse width. The output signal causes the driver 404 to output control signals to the gates of the transistors 406-408, which repeatedly turn the transistors 406-408 on and off. The pulses in the control signal provided to the transistor 406 could lag behind the pulses in the control signal provided to the transistor 408. When turned on, the transistor 406 couples an inductor 410 to an input voltage $V_{IN}$, and the transistor 408 couples the inductor 410 to ground. The inductor 410 is coupled to a capacitor 412, and the circuit 400 produces an output voltage $V_{OUT}$ for a load. The load resistance 414 is denoted $R_L$. The amount of time each of the transistors 406-408 is turned on and off, and thus the level of the output voltage $V_{OUT}$, is controlled by the pulse width of the signal output by the PWM controller 402.

The PWM controller 402 includes any suitable structure for controlling the pulse width of a signal, such as a synchronous rectified PWM controller. The driver 404 includes any suitable structure for driving transistors. The transistors 406-408 could represent 5V+PMOS and NMOS transistors, respectively. The transistors 406-408 could be implemented as shown in FIG. 1. The inductor 410, capacitor 412, and load resistance 414 could have any suitable values.

In particular embodiments, the circuit 400 receives a 5V input voltage $V_{IN}$, drives the gates of the transistors 406-408 at 5V, and produces a 2.45 output voltage $V_{OUT}$. The circuit 400 could have a dead time of 2 ns, an output current of 0.5 A, a 50% duty cycle, and a 1 µF capacitor 412. The circuit 400 could have a total gate width of 50 mm and a frequency range of 1-20 MHz, or a width range of 10-200 mm and a frequency of 6 MHz.

Although FIG. 4 illustrates one example of a circuit 400 having transistor devices formed using HOT in conjunction with selective epitaxy, various changes may be made to FIG. 4. For example, transistor devices formed using HOT in conjunction with selective epitaxy could be used in any other suitable circuit.

Figure 5:
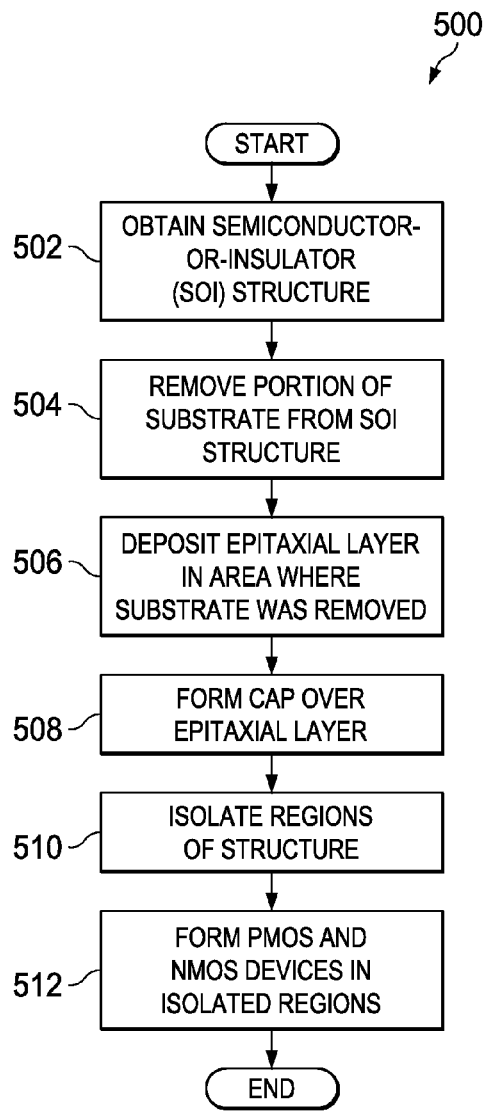
FIG. 5 illustrates an example method for forming an integrated circuit device using HOT in conjunction with selective epitaxy according to this disclosure.

FIG. 5 illustrates an example method 500 for forming an integrated circuit device using HOT in conjunction with selective epitaxy according to this disclosure. The embodiment of the method 500 shown in FIG. 5 is for illustration only. Other embodiments of the method 500 could be used without departing from the scope of this disclosure.

As shown in FIG. 5, a semiconductor-on-insulator (SOI) structure is manufactured or otherwise obtained at step 502. The SOI structure may include a first substrate material (such as a p-type wafer), a second substrate material (such as an n-type material), and a buried layer separating the first and second substrate materials. The first and second substrate materials can have different crystalline orientations, such as when the first substrate material has a (100) orientation and the second substrate material has a (110) orientation.

A portion of the second substrate material is removed from the SOI structure at step 504. This could include, for example, masking the SOI structure and removing a portion of the n-type substrate to expose the underlying p-type wafer. An epitaxial layer is deposited in the area where the second substrate material has been removed at step 506. This could include, for example, forming a graded silicon germanium epitaxial layer over the exposed portion of the p-type wafer. A cap is formed over the epitaxial layer at step 508. This could include, for example, forming a silicon cap over the silicon germanium epitaxial layer.

At this point, the structure includes two different regions. One region has the original second substrate material, and another region has the epitaxial layer and cap. The different regions of the structure are isolated at step 510. This could include, for example, forming trenches around and between the different regions. PMOS and NMOS devices are formed in the isolated regions at step 512. For example, the PMOS device can be formed in the region with the original second substrate material, and the NMOS device can be formed in the region with the epitaxial layer and cap.

Although FIG. 5 illustrates one example of a method 500 for forming an integrated circuit device using HOT in conjunction with selective epitaxy, various changes may be made to FIG. 5. For example, while shown as a series of steps, various steps in FIG. 5 could overlap, occur in parallel, or occur in a different order.

It may be advantageous to set forth definitions of certain words and phrases that have been used within this patent document. Terms such as "above" and "below," when used with reference to structures in the drawings, simply refer to aspects of the structures when viewed at particular directions. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A semiconductor apparatus comprising:
    a first substrate;
    a second substrate located over a first portion of the first substrate and separated from the first substrate by a buried layer;
    a first transistor at least partially in the second substrate;
    an epitaxial layer located over a second portion of the first substrate and isolated from the second substrate;
    a cap located over the epitaxial layer; and
    a second transistor at least partially in the cap and over the epitaxial layer;
    wherein the second substrate and the epitaxial layer have bulk properties with different electron and hole mobilities; and
    wherein at least one of the transistors is configured to receive one or more signals of at least about 5V.

2. The semiconductor apparatus of claim 1, wherein:
    the first transistor comprises a p-channel metal oxide semiconductor (PMOS) transistor; the second transistor comprises an n-channel metal oxide semiconductor (NMOS) transistor.

3. The semiconductor apparatus of claim 1, wherein:
    the first substrate has a first crystalline orientation; and
    the second substrate has a second crystalline orientation.

4. The semiconductor apparatus of claim 3, wherein the epitaxial layer has the first crystalline orientation.

5. The semiconductor apparatus of claim 1, wherein the first substrate and the cap comprise a common semiconductor material.

6. The semiconductor apparatus of claim 3, wherein:
    the first substrate comprises p-type silicon having a (100) crystalline orientation;
    the second substrate comprises n-type silicon having a (110) crystalline orientation; and
    the cap comprises p-type silicon.

7. The semiconductor apparatus of claim 1, wherein the epitaxial layer comprises silicon germanium.

8. The semiconductor apparatus of claim 7, wherein the silicon germanium has a germanium concentration of approximately 15%.

9. An apparatus comprising:
    a substrate structure comprising:
        a first substrate;
        a second substrate located over a first portion of the first substrate and separated from the first substrate by a buried layer;
        an epitaxial layer located over a second portion of the first substrate and isolated from the second substrate, wherein the second substrate has a higher hole mobility than the epitaxial layer, wherein the epitaxial layer has a higher electron mobility than the second substrate, and wherein the hole and electron mobilities are bulk properties; and
        a cap located over the epitaxial layer; and
    first and second transistors, the first transistor at least partially in the second substrate, the second transistor at least partially in the cap and over the epitaxial layer, at least one of the transistors configured to receive one or more signals of at least about 5V.

10. The apparatus of claim 9, wherein:
the first transistor comprises a p-channel metal oxide semiconductor (PMOS) transistor; and the second transistor comprises an n-channel metal oxide semiconductor (NMOS) transistor.

11. The apparatus of claim 9, wherein:
the first substrate has a first crystalline orientation; and
the second substrate has a second crystalline orientation.

12. The apparatus of claim 11, wherein the epitaxial layer has the first crystalline orientation.

13. The apparatus of claim 11, wherein:
the first substrate comprises p-type silicon having a (100) crystalline orientation;
the second substrate comprises n-type silicon having a (110) crystalline orientation; and
the cap comprises p-type silicon.

14. The apparatus of claim 9, wherein the epitaxial layer comprises silicon germanium.

* * * * *

UNITED STATES PATENT AND TRADEMARK OFFICE
CERTIFICATE OF CORRECTION

PATENT NO. : 8,395,216 B2
APPLICATION NO. : 12/589027
DATED : March 12, 2013
INVENTOR(S) : Alexander H. Owens It is certified that error appears in the above-identified patent and that said Letters Patent is hereby corrected as shown below:

Title Page:

Item 73, please change the Assignee from "Texas Instruments Incorporated, Dallas, TX (US)" to --National Semiconductor Corporation, 2900 Semiconductor Drive, Santa Clara, CA 95051--.

Signed and Sealed this
Fifteenth Day of October, 2013

Teresa Stanek Rea
*Deputy Director of the United States Patent and Trademark Office*